US007955582B2

(12) United States Patent
Seidl et al.

(10) Patent No.: US 7,955,582 B2
(45) Date of Patent: Jun. 7, 2011

(54) METHOD FOR PRODUCING CRYSTALLIZED SILICON AS WELL AS CRYSTALLIZED SILICON

(75) Inventors: Albrecht Seidl, Niedernberg (DE); Ingo Schwirtlich, Miltenberg (DE)

(73) Assignee: Schott Solar GmbH, Alzenau (DE)

( * ) Notice: Subject to any disclaimer, the term of this patent is extended or adjusted under 35 U.S.C. 154(b) by 706 days.

(21) Appl. No.: 11/956,688

(22) Filed: Dec. 14, 2007

(65) Prior Publication Data
US 2008/0152568 A1 Jun. 26, 2008

(30) Foreign Application Priority Data

Dec. 22, 2006 (DE) .......................... 10 2006 062 117

(51) Int. Cl.
*C01B 33/02* (2006.01)
(52) U.S. Cl. ........ 423/348; 423/349; 423/350; 423/325; 423/335; 423/337; 427/213; 427/215; 427/557; 427/212; 427/553; 117/77; 117/928; 117/930; 117/18; 117/200
(58) Field of Classification Search .................. None
See application file for complete search history.

(56) References Cited

U.S. PATENT DOCUMENTS

| 4,415,401 A * | 11/1983 | Wald et al. ................. 117/20 |
| 4,766,477 A | 8/1988 | Nakagawa et al. | |
| 5,098,229 A | 3/1992 | Meier et al. | |
| 5,431,743 A * | 7/1995 | Schwirtlich .................. 136/258 |
| 6,007,869 A * | 12/1999 | Schreieder et al. ........... 427/213 |
| 6,562,132 B2 | 5/2003 | Mackintosh et al. | |

FOREIGN PATENT DOCUMENTS

| DE | 1291322 | 3/1969 |
| EP | 0054656 | 6/1982 |
| JP | 5279187 | 10/1993 |

OTHER PUBLICATIONS

Journal: "New crystalline silicon ribbon materials for photovoltaics", Journal of physics Condensed Matter, vol. 16, 2004, pp. R1615-R1648, Hahn et al.*
Pivac et al, "Comparative Studies of EFG Poly-Si Grown by Different Procedures", Solar Energy Materials & Solar Cells 72, 2002, pp. 165-171.
Kalejs, "Point Defect, Carbon and Oxygen Complexing in Polycrystalline Silicon", Journal of Crystal Growth 128, 1993, pp. 298-303.

* cited by examiner

*Primary Examiner* — Melvin C Mayes
*Assistant Examiner* — Smita Patel
(74) *Attorney, Agent, or Firm* — Dennison, Schultz & MacDonald

(57) ABSTRACT

A method for producing crystallized silicon according to the EFG process by using a shaping part, between which part and a silicon melt, crystallized silicon grows in a growth zone. Inert gas and at least water vapor are fed into the silicon melt and/or growth zone, by means of which the oxygen content of the crystallized silicon is increased. From 50 to 250 ppm of vapor water is added to the inert gas, and the inert gas has an oxygen, CO and/or $CO_2$ content of less than 20 ppm total.

16 Claims, 5 Drawing Sheets

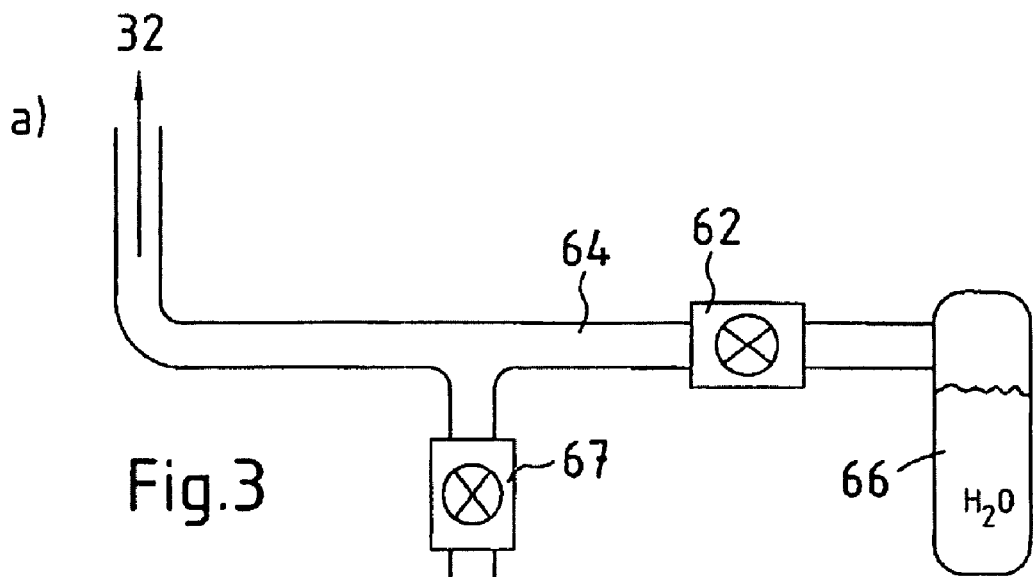
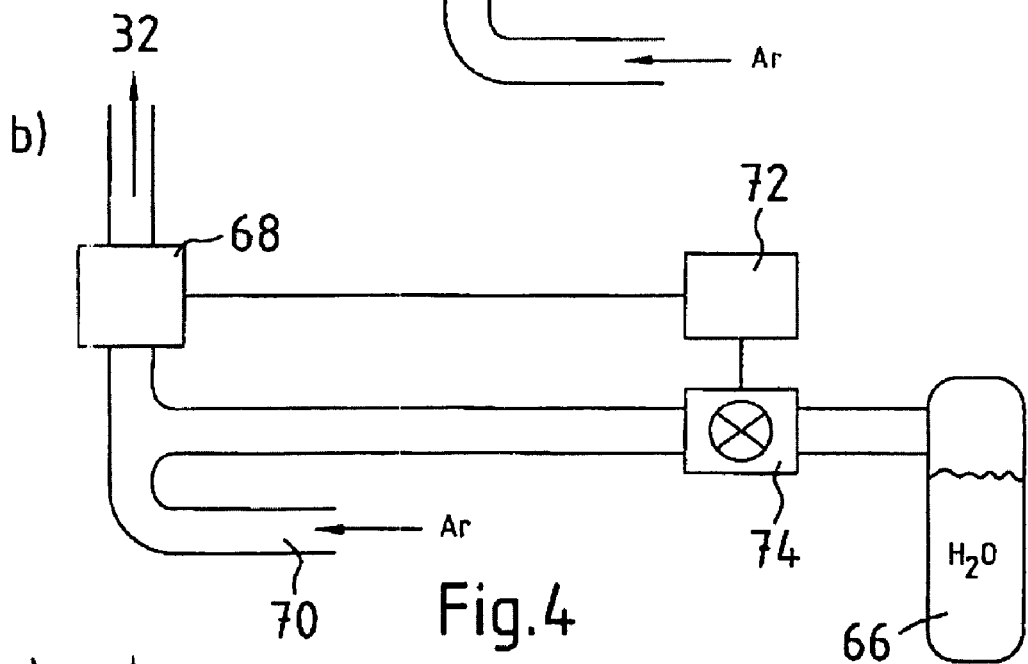
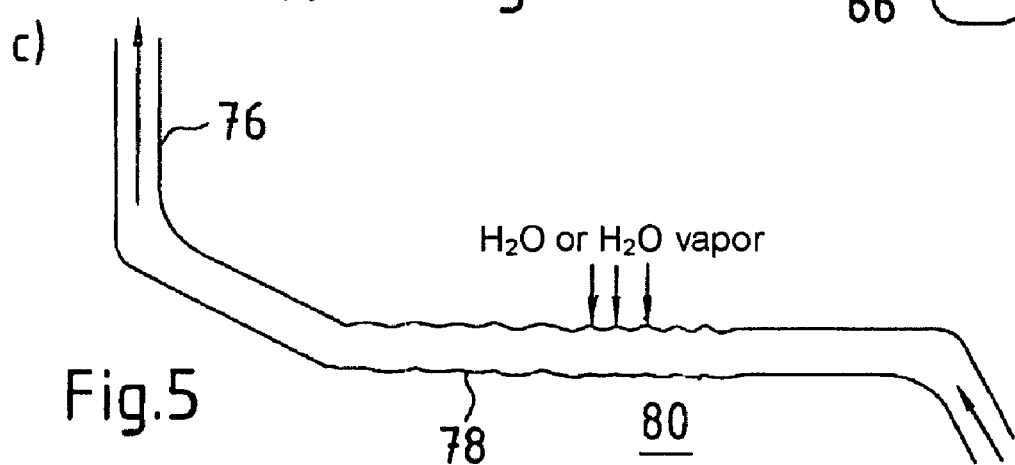

the technology as the basis for manufacturing low-cost terrestrial solar cells; Proc. $3^{rd}$ ECPVSEC, Cannes 1980, 553", "J. P. Kalejs, L.-Y. Chin; Modeling of ambient meniscus melt interactions associated with carbon and oxygen transport in EFG of silicon ribbon; J. Electrochem Soc. 129 (1982) 1356"; "B. Pivac, V. Borjanovic, I. Kovacevic, B. N. Evtody, E. A. Katz; Comparative studies of EFG poly-Si grown by different procedures; Solar Energy Mat. & Solar Cells 72 (2002) 165", it is known that the oxygen content of the silicon produced according to the EFG process can be increased beforehand to above $1\times10^{17}$ cm$^{-3}$ by the controlled addition of carbon monoxide or carbon dioxide to the inert gas, and that this way a significant increase in the average value of the minority carriers lifetime and/or the degrees of efficiency can accordingly be achieved with solar cells.

METHOD FOR PRODUCING CRYSTALLIZED SILICON AS WELL AS CRYSTALLIZED SILICON

BACKGROUND OF THE INVENTION

The invention relates to a method for producing crystallized silicon according to the EFG process using a shaping part, between which and a silicon melt crystallized silicon grows in a growth zone, whereby the inert gas and at least water vapor are fed into the silicon melt and/or growth zone, by means of which the oxygen content of the crystallized silicon is increased. The invention further relates to crystallized silicon, which is produced according to the EFG process and contains carbon and oxygen.

Silicon produced according to the EFG (edge-defined filmfed growth) process is crystallized silicon that is obtained by using a capillary slot as a shaper for the melt in the form of thin-walled ribbons or polygonal or cylindrical thin-walled tubes of crystallized silicon. The related method and embodiments thereof are described, for example, in U.S. Pat. No. 5,098,229 or U.S. Pat. No. 6,562,132, as well as in the cited documents.

When crystallized silicon is produced according to the EFG process, silicon is grown in an open-top vacuum chamber with a built-in furnace, bypass devices and, in particular, a crucible to receive the silicon melt. Independent of the concrete embodiment, an inert gas, such as argon, continuously flows through the vacuum chamber at normal pressure. These provisions can prevent and/or minimize air and/or oxygen from entering the vacuum chamber and the associated oxidation of the silicon melt, the hot graphite parts in the vacuum chamber, as well as of the crystallized silicon, like silicon ribbons or silicon tubes.

When producing high-quality silicon by means of the EFG process, it is of crucial importance that the level of the silicon melt, namely the molten pool, is possibly kept stable, so that the thermal conditions in the crystallization area, that is, in the area between the shaping part and silicon melt are kept stable. This is ensured by continuously recharging the silicon granules which can be conveyed and dosed into the crucible in a controlled manner. In this case, control means that the mass of the silicon granules to be recharged corresponds to the mass leaving the melt as a result of the growth of the crystallized silicon, namely the ribbon and/or tube.

Appropriately crystallized silicon is used to a large extent in solar cells. Because of the photovoltaic properties of the silicon grown by the EFG process, it is important that the melt is contained in a graphite crucible, and not in a quartz crucible and/or oxide ceramic crucible, as is the case with other methods, such as the Czochralski crystallization method, according to which a massive crystal is pulled out of the melt, or with directional solidification of the melt in the crucible.

In the EFG process, the melt is not in direct contact with oxidic material, but exclusively with graphite, which then reacts to become silicon carbide in the contact area with the silicon melt. Consequently, in the EFG process the carbon content of the melt inevitably has the order of magnitude of the solubility of carbon in the silicon melt determined by the phase diagram silicon-silicon carbide as well as by the temperature, whereas the oxygen content is comparatively low, typically below $5\times10^{15}$ cm$^{-3}$ and thus approx. two orders of magnitude below the silicon produced by means of one of the previously mentioned further crystallization methods.

From U.S. Pat. No. 4,415,401 (DE-C-31 09 059) and several complementary publications, like "B. Mackintosh, J. P. Kalejs, C. T. Ho., F. V. Wald; Multiple EFG silicon ribbon The addition of a carbon-containing oxygen source, like CO or $CO_2$ (U.S. Pat. No. 4,415,401) is preferred compared to the addition of air and/or oxygen because an increased oxygen content in the atmosphere of the vacuum chamber may primarily lead to increased burnup of the graphitic components, and hence to quicker destruction thereof. Using air and/or oxygen, the required carbon monoxide, which, according to U.S. Pat. No. 4,415,401, reacts with the silicon melt to become silicon carbide, will not be formed until a corresponding reaction occurs. In this process, the oxygen in the melt will be diluted. Thus, the direct addition of carbon monoxide and/or carbon dioxide reduces the burnup of the furnace components with otherwise the same effect. According to the known publications and taking these considerations into account, with the EFG process, silicon is produced with increased oxygen content by the addition of carbon monoxide. However, the disadvantage of the related method is that the proportion of silicon carbide and/or carbon in the melt increases together with the oxygen concentration, which may result in the properties of the crystallized silicon deteriorating, especially when used in solar cells.

According to U.S. Pat. No. 4,415,401 (DE-A-31 09 51), the melting zone should be fed with inert gas of the highest available purity. If need be, a maximum of between 10 and 25 ppm of water vapor as impurity may be contained.

DE-B-1 291 322 refers to a method for growing a semiconductor crystal with differently doped zones. In order to achieve the differently doped zones, an oxidizing gas flow is used.

According to JP-A-05 279 187, $TiO_2$ monocrystals can be grown with the EFG process. In order to achieve stabilization of the crystal structure, $H_2O$ can be added in a proportion of 1% to the inert gas containing oxygen that flushes the melting zone.

The citation Pivac, B; Borjanovic, V; Kovacevic, I; Evtody, B N; Katz, E A; "Comparative studies of EFG poly-Si grown by different procedures", Solar Energy Mat. & Solar Cells 72 (202), pp. 165-171, deals with impurities in polycrystalline silicon, namely depending on the methods eligible for application, including the Czochralski method, float zone (FZ) method and EFG method.

In the citation Kalejs J P: "Point defect, carbon and oxygen complexing in polycrystalline silicon", Journal of Crystal Growth 128 (1993), pages 298-303, the theory of the occurrence of point defects as a dependency of the relation between the growth velocity and temperature gradient known from crystallization of monocrystalline, dislocation-free silicon according to the Czochralski method and float zone (FZ) method is transferred to EFG conditions.

EP-A-0 54 656 refers to a method for crucible-free zone melting.

The subject matter of DE-C-33 17 954 is a semiconductor element with a semiconductor layer of polycrystalline silicon film.

SUMMARY OF THE INVENTION

The present invention has the goal of further developing a method as well as crystallized silicon of the type mentioned above, such that an increase in oxygen content can be achieved without the compulsory respective increase in carbon content.

According to the present invention, the goal is achieved by a method of the type described above, in which 50 ppm to 250 ppm water vapor is added to the inert gas, whereby the inert gas has an oxygen, CO and/or $CO_2$ content of less than 20 ppm in total.

Surprisingly, it was found that the addition of pure water vapor to an inert gas, such as argon, allows a significant increase in the oxygen concentration in the melt and/or crystalline silicon to be achieved without increased oxidation of the graphite parts, and without increased formation of silicon carbon on the melt. It could be determined that an increased growth of silicon carbide is not associated with the oxygen content of crystallized silicon dependent on the water vapor content of the inert gas. Even at the highest achieved oxygen concentrations, the carbon content in crystallized silicon still lies above solubility, and so must in part be present in the form of precipitates, but cannot be observed microscopically. Silicon with such increased oxygen content and simultaneously the finest sub-microscopically distributed carbon containing precipitates presents significantly improved photovoltaic properties. With an oxygen, CO and/or $CO_2$ content of overall less than 20 ppm in the inert gas, undesired carbon and/or silicon carbide concentrations in the crystallized silicon are avoided.

The controlled addition of water vapor can be performed by means of a mass flow rate meter, which is fed by a vapor cell that produces the water vapor. In the process the desired water vapor content in the inert gas results from the relationship between the adjusted water vapor flow and the inert gas flow, which should be measured independently thereof.

A further possibility is to measure the water vapor content continuously or intermittently at the inlet of the inert gas into the vacuum chamber, and control the water vapor addition by means of a control valve.

A further possibility provides that defined water vapor from a reservoir with known water content (for example pure water) diffuses via a water and/or water vapor permeable membrane into the inert gas.

According to a further noteworthy proposal of the present invention, it is provided that chlorine-containing silicon granules with a chlorine content between 1 ppmw (parts per million per weight) and 50 ppmw are melted for the formation of, or by, the silicon melt. Especially satisfactory results were achieved using granules with a chlorine content of 10 ppmw. The silicon granules containing chlorine may be used for recharging only, if necessary.

The spherical granules should thereby be melted to a sphere diameter between 0.5 mm and 5 mm, where especially 90% of the granules should have a sphere diameter distribution between 0.8 mm and 3 mm. The corresponding granules may be produced by fluidized bed reaction using trichlorsilane or other chlorsilanes. Silicon granules, mechanically broken into small pieces, which are produced from coarse silicon pieces by the Siemens process, also using trichlorsilane or other chlorsilanes, are likewise suitable where the grain size distribution should be between mesh 0.5 and mesh 5, preferably 90% between mesh 1 and mesh 3. Corresponding silicon with suitable chlorine content can be produced according to the teaching of U.S. Pat. No. 5,077,028. With the EFG process, the ideal grain size distribution mentioned above permits adequate quick melting. This is required to supply adequate amounts of the contained chlorine to the silicon melt.

The invention also features a crystallized silicon which is produced according to the EFG process, in particular according to the previously elucidated procedures, in which the crystallized silicon has a total carbon content CC and a total oxygen content CO at the rate of 1/50=CO/CC=1/500 as well as a chlorine content $C_{CL}$ of $5\times10^{15}$ atoms/cm$^3$=$C_{CL}$=$1\times10^{17}$ atoms/cm$^3$. It is especially provided that the $C_C$ to $C_O$ ratio is approx. 100:1, where oxygen is essentially present in the crystallized silicon in a diluted form. Furthermore, carbon should be present at a maximum carbon content of approx. $8\times10^{17}$ atoms/cm$^3$ in the form of oversaturated solution.

It is particularly provided that the oxygen content $C_O$ is $8\times10^{15}$ atoms/cm$^3 \leq C_O \leq 4\times10^{16}$ atoms/cm$^3$ and that the carbon content is $5\times10^{17}$ atoms/cm$^3 \leq C_C \leq 3\times10^{18}$ atoms/cm$^3$. Preferably, the oxygen content is approx. $2\times10^{16}$ atoms/cm$^3$ and/or the carbon content $C_C$ is approx. $2\times10^{18}$ atoms/cm$^3$.

Hence, the subject matter of the invention is silicon produced according to the EFG process, in which the relationship between the total carbon content in silicon, which for example is determined by means of combustion analysis, and the oxygen content, which can be determined by means of FTIR, is in the range from 50 to 500. The absolute oxygen content in silicon should thus range between $8\times10^{15}$ atoms/cm$^3$ and $4\times10^{16}$ atoms/cm$^3$. The size of the precipitates containing carbon, such as silicon carbide, should be kept to a minimum. This is achieved, in particular, by using water vapor. According to the present invention, the absolute carbon content determined by combustion analysis should be in the range between $5\times10^{17}$ atoms/cm$^3$ and $3\times10^{18}$ atoms/cm$^3$. Further, crystallized silicon is characterized by at least 90% of the size of the precipitates lying below 50 nm.

In order to achieve, in particular, satisfactory photovoltaic properties in solar cells, the ratio carbon/oxygen should be 100:1, with the oxygen content being in the range of $2\times10^{16}$ atoms/cm$^3$ and the carbon content in the range of $2\times10^{18}$ atoms/cm$^3$.

The effect of oxygen is to create getter centers for metallic impurities. Moreover, it should be assumed that the submicroscopic carbon-containing precipitates also have a similar getter effect. Thus, the literature assumes that silicon carbide precipitates may getter in silicon metals. The crystallized silicon according to the present invention grown by the EFG process consequently combines both properties.

A further effect of the water vapor introduced in a controlled manner into the inert gas atmosphere of the vacuum chamber may be that hydrogen is released on decomposition of the water on the hot surfaces of the fittings. This hydrogen diffuses into the silicon melt and also into the solidifying crystal and remains there as a result of the rapid cooling of silicon typical of EFG, namely of the silicon tube and/or ribbon along an axial temperature gradient typical of EFG which is in the region directly above the solidification range, between 200 K/cm and 400 K/cm, preferably 300 K/cm. Hydrogen has a passivating effect in the production of solar cells. Unlike known proposals, where the hydrogen is only added during the solar cell process, according to the teaching of the present invention, hydrogen is already present in crystallized silicon, namely in the unprocessed silicon wafer.

Hydrogen is preferably diffused to the stress fields in the environment of lattice imperfections, such as dislocations, dislocation clusters, low angle grain boundaries and grain boundaries attaching to free boundary layer bonds, on which most of the passivating effect is based. In the case of silicon grown by the EFG process, it is also important that a part of the carbon present in the silicon is incorporated along the many twin grain boundaries typical of EFG in the form of SiC layers into the silicon lattice, tensioning it at that point. Metallic impurities also diffuse preferentially to lattice areas tensioned in that way, where the former may be passivated in situ by the hydrogen already present on crystallization according to the present invention.

In this regard, it has surprisingly been found that by recharging chlorine-containing silicon granules, the effect is especially pronounced compared to recharging silicon granules of lower chlorine content, i.e. with the same (increased) oxygen content and an equal amount of finely distributed carbon as a result of a simultaneously increased chlorine content, and there follows a further improvement of the photovaltaic properties.

Thus, the crystallized silicon is further characterized in that in addition to the oxygen content and the finely distributed carbon according to the present invention, chlorine is present at a concentration of $C_{Cl}$ between $5 \times 10^{15}$ atoms/cm$^3$ and $1 \times 10^{17}$ atoms/cm$^3$. Especially satisfactory results are obtained with a chlorine content of approx. $5 \times 10^{16}$ atoms/cm$^3$.

In an embodiment it is provided that chlorine-containing silicon granules with a chlorine content between 1 ppmw and 50 ppmw, preferably approx. 10 ppmw, is melted to form, or by, the silicon melt.

On the one hand, the effect of chlorine is seen in a further getter effect regarding metallic impurities; on the other hand, it can be assumed that the concentration of metallic impurities is reduced overall by the evaporation of volatile metal chlorides from the melt.

Preferentially, spherical granules with a sphere diameter distribution between 0.5 mm and 5 mm are melted. In doing so, granules having a spherical shape should be melted, with approx. 90% having a spherical diameter distribution between 0.8 mm and 3 mm.

From the crystallized silicon ribbons and/or tubes according to the present invention, wafers may be cut out with a laser, as described in U.S. Pat. No. 6,376,797 or U.S. Pat. No. 6,423,928. Corresponding wafers from the silicon produced according to the present invention may be used for the production of solar cells of increased efficiency, either without further treatment or after a slight wet etching with a depth of, for example, 1 µm to 20 µm. Gettered metallic impurities near the surface may specifically be removed by etching.

BRIEF DESCRIPTION OF THE DRAWINGS

Further details, advantages and characteristics of the present invention are not only apparent from the claims, the features described therein—as such and/or combined—, but also from the exemplary embodiments apparent from the following description of the drawings.

In the drawings:

FIG. 3 is first exemplary embodiment for the addition of water vapor;

FIG. 4 is second exemplary embodiment for the addition of water vapor;

FIG. 5 is third exemplary embodiment for the addition of water vapor;

DESCRIPTION OF THE PREFERRED EMBODIMENTS

Figure 1:
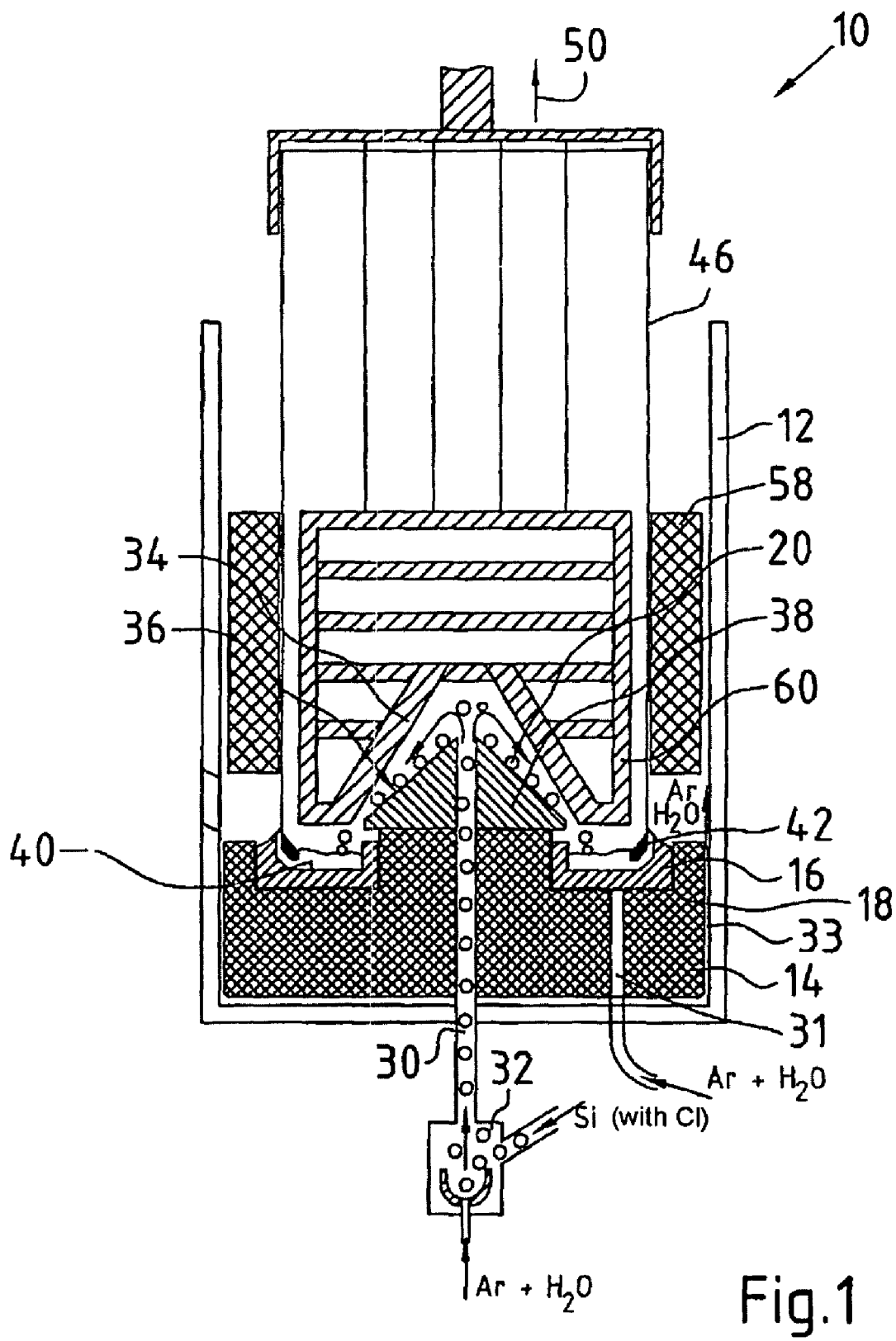
FIG. 1 is a schematic diagram of an arrangement for the production of silicon according to the EFG process.

From FIG. 1 a principal design of an arrangement is apparent, by means of which silicon is grown by the EFG (edge-defined film-fed growth) process. Thus, polygonal or cylindrical tubes or ribbons can be produced, as is possible according to the EFG process.

According to the illustration in FIG. 1, the arrangement 10 shows a housing 12 also designated as vacuum chamber, having a bottom insulation 14, in which a ring-shaped crucible 16 is arranged. In the crucible 16, i.e. in its retainer 18 which likewise has a ring geometry, the granules 20 are melted via a feeding device described in more detail below. This can be carried out, for example, via resistance heating elements or inductively.

The granules 20 fed into the crucible 16 and/or retainer 18 have a spherical, polygonal or dustlike morphology. Preferentially, however, a spherical shape with a sphere diameter distribution of 0.5 mm to 5 mm, with 90% preferably being between 0.8 mm and 3 mm should be specified. The granules 20 consisting of silicon should thereby contain chlorine at a concentration between $5 \times 10^{15}$ atoms/cm$^3$ and $1 \times 10^{17}$ atoms/cm$^3$, preferentially with a chlorine content of $5 \times 10^{16}$ atoms/cm$^3$. Corresponding spherical granules may be obtained by the fluidized bed reaction method using trichlorsilane or other chlorsilanes.

Equally suitable are silicon granules which are mechanically broken into small pieces obtained from coarse silicon pieces produced by a Siemens process using trichlorsilane or other chlorsilanes, where the grain size distribution should be between mesh 0.5 and mesh 5, with 90% preferably between mesh 1 and mesh 3. In that regard, reference is also made to the method described in U.S. Pat. No. 5,077,028, whose content shall be deemed as disclosure. In the related method, corresponding granules with the previously mentioned grain size distribution can be produced which facilitate adequate quick melting within a few seconds using the EFG process. This ensures that adequate amounts of the chlorine contained in the granules are added to the silicon melt.

The granules 20 are introduced via a duct 30 that traverses the bottom of housing 12 as well as the bottom insulation 14 by means of an injection device 32. The conveying fluid is an inert gas, like argon, with added water vapor, as will be described below. The granules 20 thereby impinge upon a bypass device 34 of an umbrella-like geometry, so that the granules 20 are then fed into the crucible 16, i.e. its retainer 18, along the surface 36 of a conic element 38. Uniform distribution of the granules 20 over the entire area of the ring-shaped retainer 28 is accomplished by a corresponding embodiment of the feeding device.

The inert gas and added water vapor may further be fed into the interior of the vacuum chamber via one or more ducts 31 opening below the crucible 16, which is flushed by the inert gas/water vapor mixture. The mixture also reaches the interior via slots 33 located between the bottom insulation 14 and housing 12, reaching in particular the area of the growth zone, that is, the area between the silicon melt 40 and slot 42.

Along the external area of the crucible 16, there is a slot 42 that produces a capillary effect and is connected via grooves or bores to the silicon melt 40, so that the melt 40 flows into the slot 42 and as a result of the capillary effect emerges on the top side forming a meniscus. The meniscus solidifies at its upper tip with pulling of the silicon, e.g. as a tube 46, so that the tube 46 and/or the solidified sections are lifted in the direction of the arrow 50 by means of a pulling device. In order to exactly adjust the amount of granules 20 to be fed into the crucible 16 to the amount of pulled out tube section, the pulling device 50 may be connected to a load cell, whose measured values are conveyed to a controller.

The granules 20 to be melted are fed in the usual way into the injection device 32 from a rack via a metering device. The metering device is connected to the controller via a load cell, so that the exact amount of granules to be melted is fed into the crucible 16 via the injection device 32, i.e. pulled out of the capillary slot 42. This amount is calculated by means of the load cell connected to the pulling device 50.

According to the EFG process, the pulling device 50 comprises a seed holder as a shaping part, which in the exemplary embodiment at the beginning of the pulling process has a geometry which corresponds to the seed of the tube to be pulled, said seed being in contact with the meniscus.

Furthermore, the tube 46 is surrounded by an insulation 58 and/or radiation shields 60 above the crucible 16, in order to cool the tube in a controlled manner.

As already mentioned, inert gas is essentially used for the conveyance of the granules 20. This is preferably argon. According to the present invention, water vapor is added to the inert gas, namely in a proportion from 50 ppm to 250 ppm. The inert gas as such should have a total proportion of oxygen and/or carbon monoxide and/or carbon dioxide of less than 20 ppm. Controlled addition of water vapor can be realized in different ways according to the illustration in FIGS. 3 to 5.

Thus, according to FIG. 3, the addition can be performed by means of a mass flow rate meter 62 that is arranged in a duct 64, and leads from a steam generator 66 to the injection device 32. The desired water vapor content in the inert gas results from the relationship between the adjusted water vapor flow and the inert gas flow that should be measured independently thereof via a device 67.

According to FIG. 4, the water vapor content may also be determined by means of a moisture metering device 68. With this device, the water vapor content in the inert gas conveyed via a duct 70 is measured continuously or intermittently in order to control the water vapor addition via a controller 72, which is connected to a control valve 74.

According to FIG. 5, it is possible to insert a water and/or water vapor permeable membrane 78 as a section of a duct 76 leading to the injection device 32, via which defined water vapor from a reservoir 80 with known water content (e.g. pure water) can diffuse into the inert gas flowing through the duct 76.

According to the present invention, the addition of water vapor is performed such that the proportion of inert gas is between 50 ppm and 250 ppm. Through this, a total oxygen content in the crystallized silicon grown from the melt of between $8 \times 10^{15}$ atoms/cm$^3$ and $4 \times 10^{16}$ atoms/cm$^3$ is achieved. At the same time, it is possible to achieve a carbon content that remains in the order of magnitude between $5 \times 10^{17}$ atoms/cm$^3$ and $3 \times 10^{18}$ atoms/cm$^3$ by the addition of water vapor, in contrast to known methods, in which water vapor is not introduced to increase the oxygen content. In the process, carbon is present as a precipitate, such as silicon carbide, carbon being present up to a carbon content of approx. $8 \times 10^{17}$ atoms/cm$^3$ in the form of oversaturated solution. The oxygen as such is present in the silicon in a diluted form.

Figure 2:
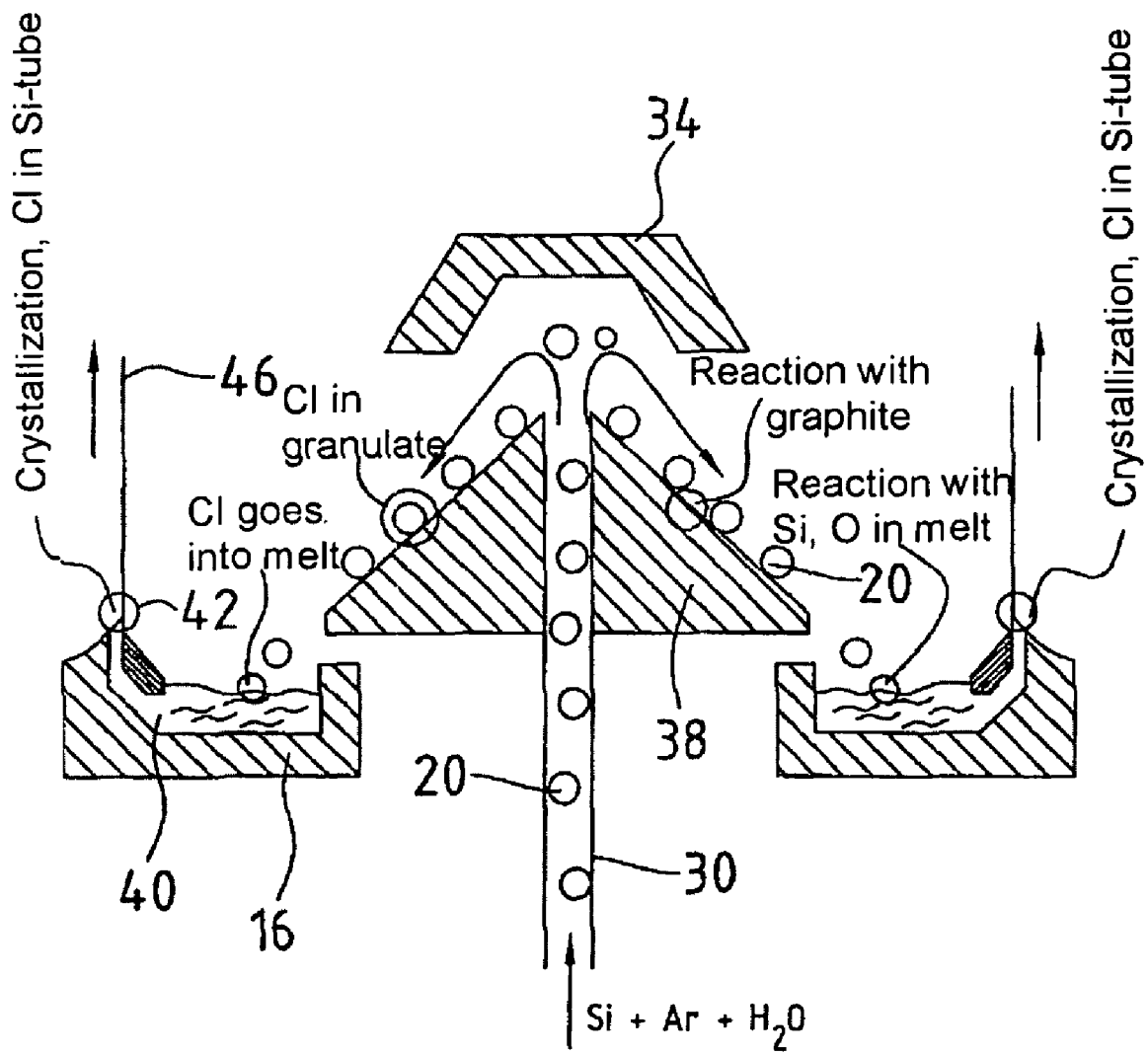
FIG. 2 is schematic diagram showing the method according to the invention.

FIG. 2 principally exemplifies how the chlorine and/or oxygen present in the granules 20 reacts with silicon. The chlorine atoms present in the granules 20 go into the melt, and during crystallization remain in the crystallized silicon, which in the exemplary embodiment is pulled out of the melt as a tube.

For one thing, the water vapor reacts with the graphite fittings in the vacuum chamber, thus, for example, also with the conic element 38. Further, there is a reaction with the silicon melt 40 as well. Through these reactions, for one thing, the oxygen is diluted in the silicon, and for another thing, material in the form of SiC is introduced by the graphite.

Figure 6:
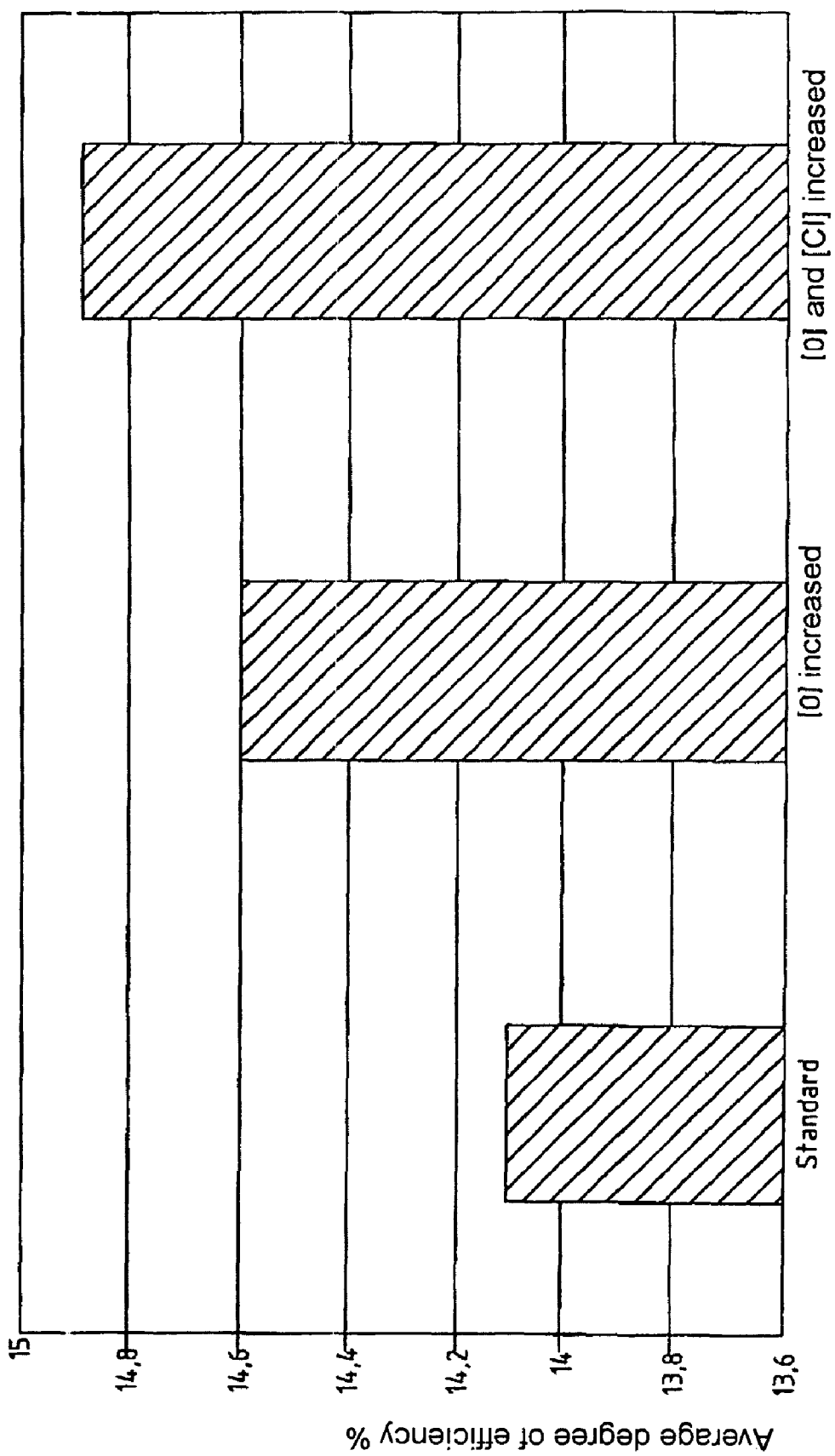
FIG. 6 is a graph illustrating the change of efficiency in solar cells.

By specifically increasing the oxygen content in the crystallized silicon and the adjusted relationship between the absolute carbon content and the absolute oxygen content according to the present invention, an increase in the degree of efficiency of solar cells produced with crystallized silicon grown according to the previously described EFG process results. This is exemplified in FIG. 6.

Figure 7:
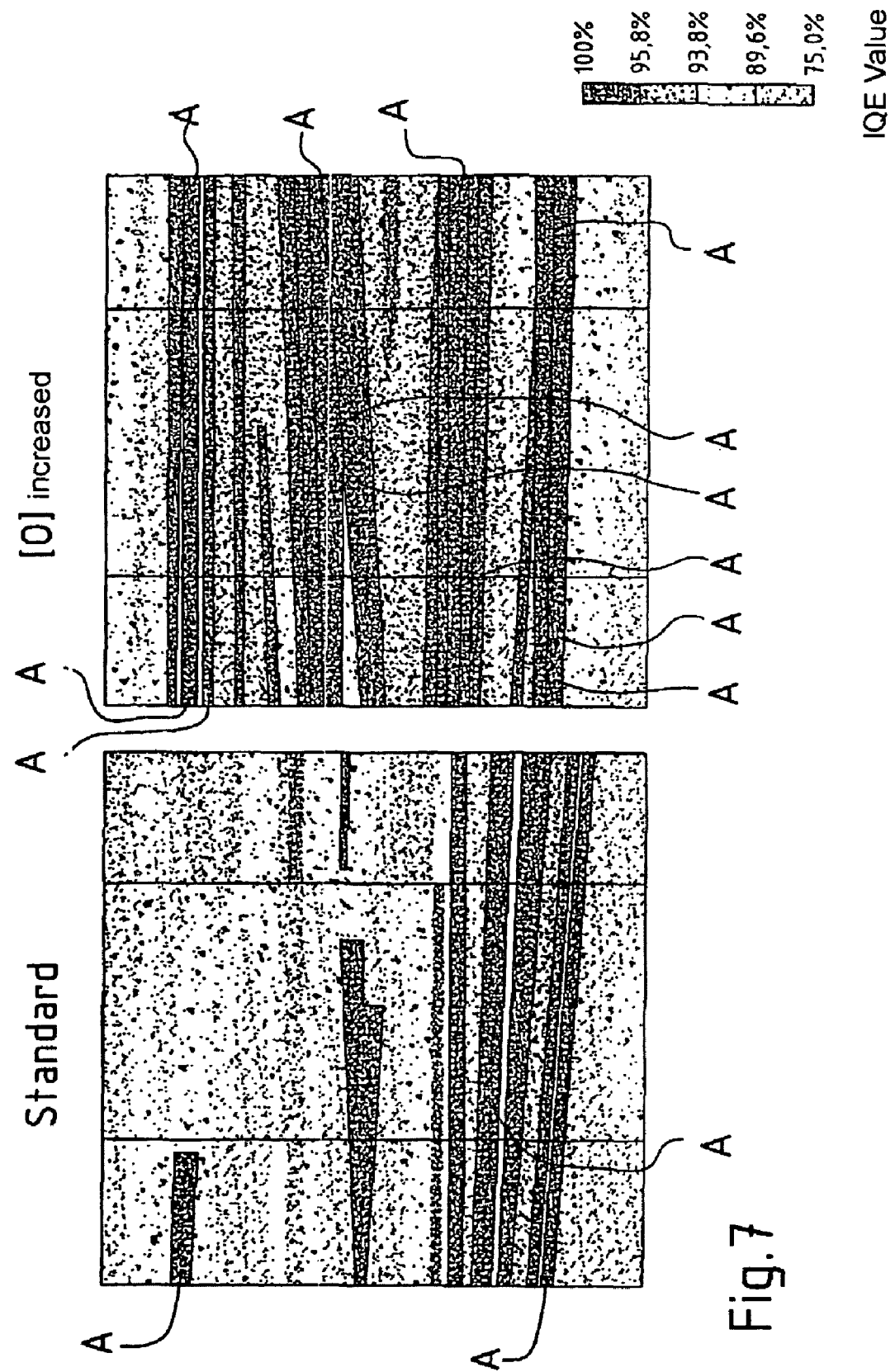
FIG. 7 illustrates the internal quantum efficiency of solar cells.

FIG. 7 shows that the internal quantum efficiency (IQE) is increased in solar cells, if the silicon is produced with increased oxygen content by means of the method according to the present invention. So, it can be seen that in an EFG solar cell with a relationship according to the present invention involving increased oxygen content and carbon content/oxygen content the areas showing an IQE value of 100% and a smaller structure in the illustrations (red areas in the colored illustration, areas designated with "A" in the black and white illustration) are larger than EFG solar cells of the prior art.

REFERENCE NUMERALS

10 Arrangement
12 Housing
14 Bottom insulation
16 Crucible
18 Retainers
20 Granule
30 Duct
31 Duct
32 Injection device
33 Slot
34 Bypass device
36 Surface
38 Conic element
40 Silicon melt
42 Slot
46 Tube
50 Pulling device
58 Insulation
60 Radiation shield
62 Mass flow rate meter
64 Duct
66 Steam generator
67 Device
68 Moisture metering device
70 Duct
72 Controller
74 Control valve
76 Duct
78 Membrane
80 Reservoir

What is claimed is:

1. A method for producing crystallized silicon according to the EFG process, comprising the steps of:
    growing crystallized silicon in a growth zone between a shaping part and a silicon melt, and feeding inert gas and water vapor into the silicon melt and/or growth zone, thereby increasing oxygen content of the crystallized silicon, wherein from 50 ppm to 250 ppm of water vapor is added to the inert gas, the inert gas having a total oxygen, CO and $CO_2$ content of less than 20 ppm.

2. The method according to claim 1, wherein the water vapor content in the inert gas is controlled by means of a mass flow rate meter or a moisture metering device.

3. The method according to claim 1, wherein the water vapor diffuses into the inert gas via a water and/or water vapor permeable membrane from a reservoir containing a known amount of water.

4. The method according to claim 1, wherein the silicon melt is formed by melting chlorine-containing silicon granules with a chlorine content between 1 ppmw and 50 ppmw.

5. The method according to claim 4, wherein the chlorine-containing silicon granules are used for recharging.

6. The method according to claim 1, wherein the silicon melt is formed by melting granules of spherical shape with a sphere diameter distribution between 0.5 mm and 5 mm.

7. The method according to claim 6, wherein 90% of the granules of spherical shape have a sphere diameter distribution between 0.8 mm and 3 mm.

8. A crystallized silicon produced by the method according to claim 1, and which contains carbon and oxygen, wherein the crystallized silicon has a total carbon content $C_C$, and a total oxygen content $C_O$ in a ratio of $1/50 \leqq C_O/C_C \leqq 1/500$ and a chlorine content $C_{Cl}$ of $5 \times 10^{15}$ atoms/$cm^3 \leqq C_{Cl} \leqq 1 \times 10^{17}$ atoms/$cm^3$, wherein the crystallized carbon-containing silicon has precipitates, and wherein 90% of the precipitates are of a size below 50 nm.

9. The crystallized silicon according to claim 8, wherein the ratio of the total carbon content $C_C$ to the total oxygen content $C_O$ is about 100:1.

10. The crystallized silicon according to claim 8, wherein the oxygen in the crystallized silicon consists essentially of oxygen in a diluted form.

11. The crystallized silicon according to claim 8, wherein the oxygen content $C_O$ is $8 \times 10^{15}$ atoms/$cm^3 \leqq CO \leqq 4 \times 10^{16}$ atoms/$cm^3$, and the carbon content $C_C$ is $5 \times 10^{17}$ atoms/$cm^3 \leqq C_C \leqq 3 \times 10^{18}$ atoms/$cm^3$.

12. The crystallized silicon according to claim 8, wherein the oxygen content $C_O$ is $2 \times 10^{16}$ atoms/$cm^3$ and/or the carbon content $C_C$ is $2 \times 10^{18}$ atoms/$cm^3$.

13. The crystallized silicon according to claim 8, wherein carbon is present up to a content of about $8 \times 10^{17}$ atoms/$cm^3$ in the form of an oversaturated solution.

14. The crystallized silicon according to claim 8, having a chlorine content of about $5 \times 10^{16}$ atoms/$cm^3$.

15. A wafer cut out of the crystallized silicon according to claim 8.

16. A solar cell comprising crystallized silicon according to claim 8.

* * * * *